United States Patent [19]

Kamensky et al.

[11] Patent Number: 4,972,143
[45] Date of Patent: Nov. 20, 1990

[54] DIAPHRAGM TEST PROBE

[75] Inventors: Albert Kamensky, Redondo Beach; James H. Cliborn, Topanga; Louis E. Gates, Jr., Westlake Village, all of Calif.

[73] Assignee: Hughes Aircraft Company, Los Angeles, Calif.

[21] Appl. No.: 277,819

[22] Filed: Nov. 30, 1988

[51] Int. Cl.$^5$ .......................... G01R 1/02; G01R 1/04
[52] U.S. Cl. ................................ 324/158 F; 324/72.5; 324/158 P
[58] Field of Search .................. 324/73, 158 P, 158 F, 324/72.5

[56] References Cited

U.S. PATENT DOCUMENTS

| | | | |
|---|---|---|---|
| 3,596,228 | 7/1971 | Reed et al. | 324/158 F |
| 3,832,632 | 8/1974 | Ardezzone | 324/158 P |
| 4,566,184 | 1/1986 | Higgins et al. | 324/158 P |
| 4,636,722 | 1/1987 | Ardezzone | 324/158 P |
| 4,649,339 | 3/1987 | Grangroth et al. | 324/158 F |
| 4,686,463 | 8/1987 | Logan | 324/158 F |
| 4,791,363 | 12/1988 | Logan | 324/158 P |
| 4,820,976 | 4/1989 | Brown | 324/158 F |
| 4,922,192 | 5/1990 | Gross et al. | 324/158 F |

Primary Examiner—Reinhard J. Eisenzopf
Assistant Examiner—William Burns
Attorney, Agent, or Firm—Leonard A. Alkov; Wanda K. Denson-Low

[57] ABSTRACT

A diaphragm test probe for establishing a detachable electrical connection to the pads on an integrated circuit chip. Leads are electrically connected to a plurality of conductive contacts which are affixed to a flexible diaphragm. The conductive contacts are arranged to match the pattern of the pads on the integrated circuit chip and are aligned with these pads using visual sighting. After alignment, fluidic pressure is applied to the flexible diaphragm, causing it to flex and, in turn, the conductive contacts to make electrical contact with the pads on the integrated circuit. A plurality of sets of conductive contacts may be affixed to a single flexible diaphragm so as to allow multiple chip testing without realignment of the test probe.

2 Claims, 2 Drawing Sheets

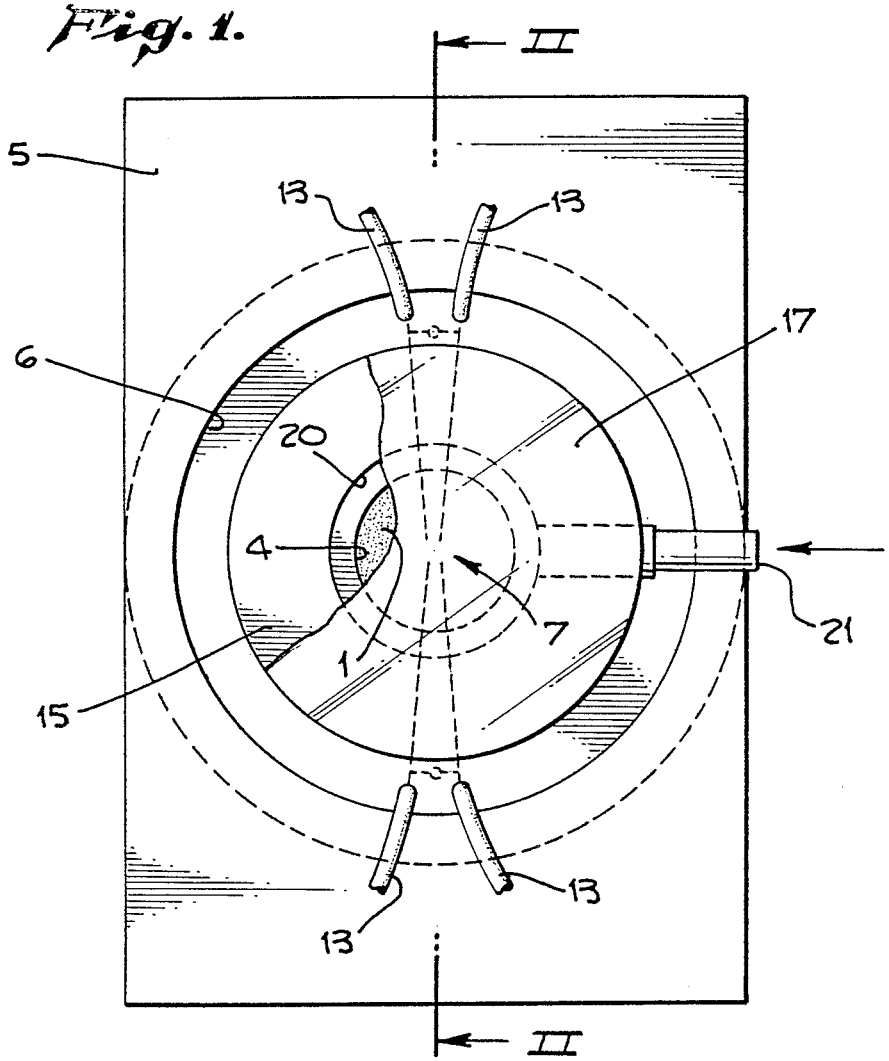
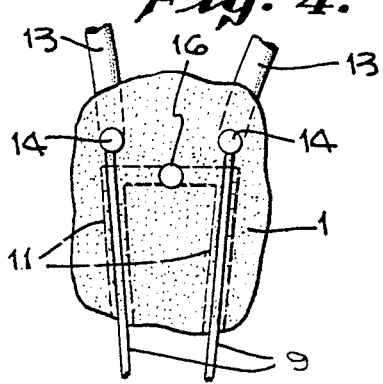
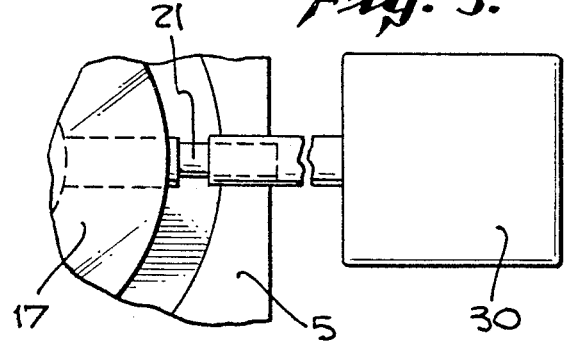

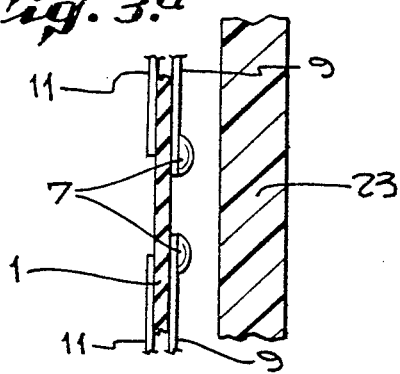
Fig. 3.a
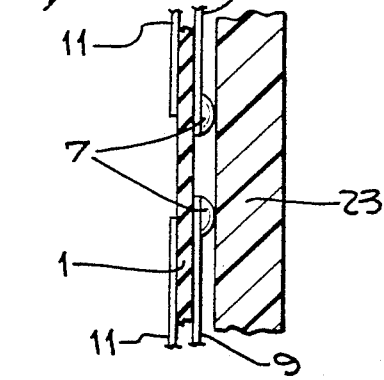
Fig. 3.b
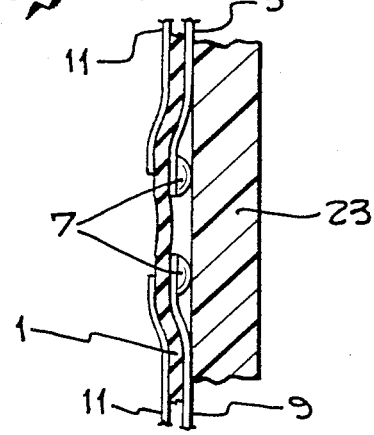
Fig. 3.c
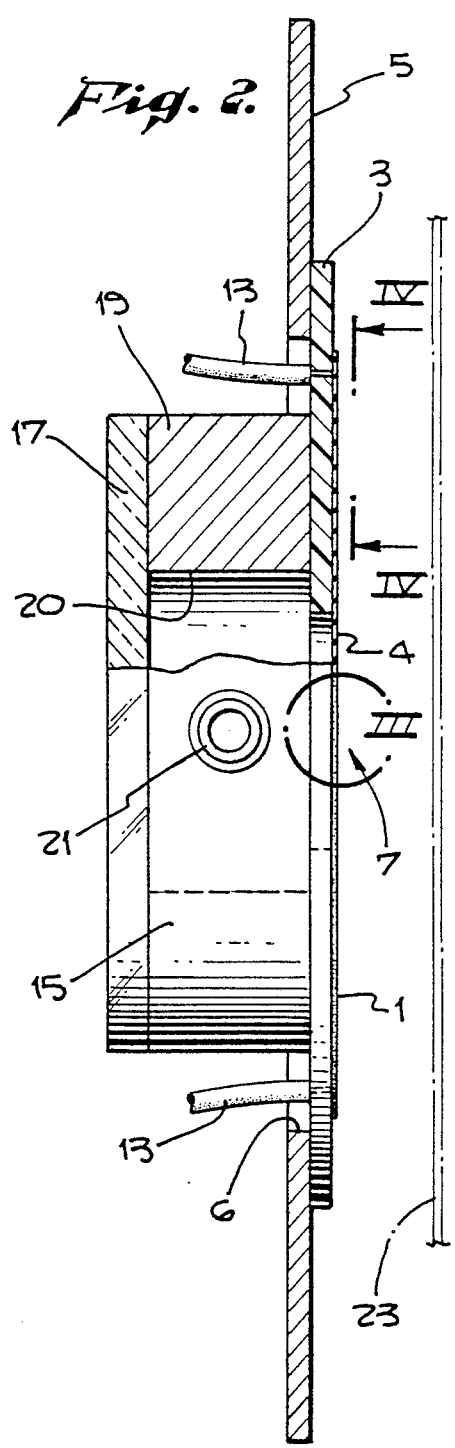
Fig. 2.

DIAPHRAGM TEST PROBE

BACKGROUND OF THE INVENTION

1. Field of the Invention

This invention relates to test probes which make electrical contact with electrical components or circuits and, more specifically, to test probes which make electrical contact with integrated circuit pads.

2. Description of Related Art

Integrated circuit chips are usually tested for viability, in wafer form, before leads are affixed to their pads.

In order to test a chip, it is necessary to make electrical connection with it. This is often done by using a test probe which has a plurality of sharply-pointed wires mounted to a rigid test head. The test probe is then pressed against the integrated circuit chip, causing the sharply-pointed wires to come in contact with the pads on the chip.

This type of test probe, however, suffers from several problems.

One problem is that the integrated circuit chip is occasionally damaged by the pressure which is required to obtain a good electrical connection and the integrated circuit chip pad is often marred with an abrasion mark.

Another problem is that it is difficult to mount the sharply-pointed wires closely together, while still maintaining electrical isolation between them. This limits the degree to which complex and densely populated integrated circuit chips may be tested.

A still further problem is that the point contact is often not able to withstand significant current.

A still further problem is that the impedance of the test probe often does not match the impedance of the cable which is connected to the test probe, thereby adversely affecting the upper limit of the frequency which can be used during the test.

SUMMARY OF THE INVENTION

One object of the present invention is to obviate these and other problems in the prior art.

Another object of the present invention is to provide a diaphragm test probe which establishes good electrical connection without damaging the component(s) under test.

A still further object of the present invention is to provide a diaphragm test probe which can electrically connect to pads on an integrated circuit chip which are spaced apart by only approximately two mils (one mil equals 0.001 inch).

A still further object of the present invention is to provide a diaphragm test probe which has an impedance which can be readily controlled to match the impedance of its driving cable, thereby facilitating high frequency testing at the wafer level.

A still further object of the present invention is to provide a diaphragm test probe which is readily adaptable to testing plural sets of pad sites without changing the initial placement of the test probe.

A still further object of the present invention is to provide a diaphragm test probe which easily aligns with the pads on the circuit under test using visual sighting.

A still further object of the present invention is to provide a diaphragm test probe for integrated circuits which can fully test an integrated circuit chip, either while the chip is still on a wafer or after it has been separated from it.

A still further object of the present invention is to provide a diaphragm test probe which is capable of carrying high current.

These and other objects, features and advantages of the present invention are achieved by affixing a plurality of soft conductive contacts to the outer surface of a flexible diaphragm. After visually aligning the contacts over the pads on the integrated circuit, fluidic pressure is uniformly applied to the inner surface of the diaphragm.

As the diaphragm flexes outwardly, the contacts first touch the integrated circuit. The initial pressure of the contacts bearing against the integrated circuit is tremendous, resulting in a solid electrical connection. Before any damage is done to the integrated circuit, however, the portion of the diaphragm surrounding the contacts further expands outwardly, ultimately coming in direct contact with the integrated circuit. When this occurs, the pressure between the contacts and the integrated circuit drops substantially, reducing the danger of damage, without upsetting the solid electrical contact which was made.

In order to control impedance, the lead to each contact is paralleled by a ground lead affixed to the other side of the diaphragm. By correctly selecting the size, spacing, thickness and placement of the contact lead and the ground lead, the impedance of the probe can be substantially matched to the impedance of the cable or cables which connect it to the test instrumentation.

BRIEF DESCRIPTION OF THE DRAWINGS

FIG. 1 is a top view of a diaphragm test probe made in accordance with the present invention.

FIG. 2 is a side view of a diaphragm test probe made in accordance with the present invention taken along the lips II—II in FIG. 1

FIG. 3(a) is a close-up side view of the portion of the diaphragm test probe shown in circle III in FIG. 1 before pressure is applied to the diaphragm.

FIG. 3(b) is a close-up side view of the portion of the test probe shown in circle III in FIG. 1 immediately after pressure is applied to the diaphragm.

FIG. 3(c) is a close-up side view of the portion of test probe shown in circle III in FIG. 1 a short while after pressure is applied to the diaphragm.

FIG. 4 illustrates a close-up top view of the portion of the diaphragm test probe shown in FIG. 1 taken along the line IV-IV.

FIG. 5 illustrates an air pressure source connected to the diaphragm test probe shown in FIG. 1.

DETAILED DESCRIPTION OF THE PREFERRED EMBODIMENT

As shown in FIGS. 1, 2, 3, 4 and/or 5, the preferred embodiment of the present invention includes a flexible diaphragm 1 which has its perimeter affixed to a substrate 3 which has an opening 4. The substrate 3, in turn, is affixed to a mounting plate 5 which has an opening 6.

Affixed to the underneath side of the flexible diaphragm 1 at its approximate center are one or more contacts 7, each electrically insulated from one another. Affixed to each of the contacts 7 are contact leads 9. Paralleling each of the contact leads 9 are ground leads 11 affixed to the top portion of the flexible diaphragm 1.

One or more coaxial cables 13 are electrically connected to the contact leads 9 and the ground leads 11 at the outer perimeter of the diaphragm 1 at the points 14 at which the contact leads 9 meet the substrate 3 and at the points 16 where the ground leads 11 the substrate 3.

Also affixed to the substrate 3 is a pressure transfer chamber 15. The chamber 15 includes a transparent cover 17, a frame portion 19 having an opening 20, and an air inlet connector 21.

The flexible diaphragm can be of any shape, including rectangular, oval, etc. In the preferred embodiment, it is circular.

It should be made of a material which is flexible, resilient and insulating. It should also be made of material which is clear so as to facilitate visual alignment of the contacts 7 with the pads on an integrated circuit wafer 23. Polyimide or benzocyclobutene (BCB) satisfies these requirements.

The flexible diaphragm 1 should be thin so as to flex upon delivery of air pressure into the air inlet connector 21. The impedance of the test probe will also be affected by the thickness of the flexible diaphragm 1. Typically, thicknesses in the range of 5 to 25 microns work best, although thicknesses in the order of a millimeter will also work.

The contact leads 9 and the ground leads 11 are typically affixed to the diaphragm 1 using well-known depositing processes, such as sputtering techniques. Typically, both surfaces of the diaphragm 1 are fully coated with a conductive material, such as copper. The portions of the surfaces which will function as the contact leads 9 and the ground leads 11 are then coated with an etch resistive material. Next, the remaining portions of the surfaces of the diaphragm 1 are etched away using standard etching techniques. The exact thickness and width of the contact leads 9 and the ground leads 11 will directly affect and control the impedance of the test probe and should be selected accordingly. Although discussed as "leads," the ground leads 11 might also be a single planar surface. In this case, it would be more properly referred to as a ground plane.

The conductive contacts 7 may be affixed to the ends of the contact leads 9 using depositing techniques, such as electro-plating. They should be made of a soft and good conductor, such as soft gold. Their exposed surface should also be rounded. Of course, the conductive contacts 7, the contact leads 9, and the ground leads 11 should be arranged so that the conductive 7 are aligned in the very same pattern as the pads on the wafer to be tested. The contacts 7 can be spaced as closely as two mils (0.002 inch) apart, each approximately occupying a one mil (0.001 inch) square and being approximately one mil (0.001 inch) thick.

If desired, a plurality of sets of the contacts 7, the contact leads 9, and the ground leads 11 can be affixed to a single diaphragm. This will allow a plurality of integrated circuit chips mounted on a common surface to be tested without readjustment of the probe. Several sets of test equipment can be used or one set can be multiplexed between all of the different sets of contacts using well-known multiplexing techniques.

It is important that the chamber 15 be air tight. To accomplish this, the joints between the cover 17, the frame 19, the substrate 3, and the air intake 21 should be air tight. The joint between the diaphragm 1 and the substrate 3 should similarly be air tight. An appropriate type of glue or sealant in all of these areas should be applied.

The cover 17 should be transparent and preferably made of plexiglass. The frame 19 should be rigid and is preferably made of aluminum. The substrate 3 should be rigid and made of an insulating material, preferably Fotoceram. The mounting plate 5 should also be rigid and is preferably made of fiberglass (PWB).

The cables 13 should have an impedance which matches the impedance established by the contact leads 9 and the ground leads 11. In the preferred embodiment, the cables 13 are 50 ohm coaxial cables. By changing the thickness, spacing and width of the contact leads 9 and the ground leads 13, other impedances could be matched.

To use the diaphragm test probe thus far described, it should be positioned over the wafer 23 as shown in FIG. 3(a). Using visual sighting, the contacts 7 should be aligned with the pads on the integrated circuit contained on the wafer 23. Once this is done, the diaphragm test probe should be rested directly on top of the wafer 23 and fluidic pressure, preferably air, should be applied to the air intake 21.

This will cause the diaphragm 1 to flex toward the wafer 23, initially causing the contacts 7 to press against the wafer 23 with great force, as shown in FIG. 3(b). Immediately thereafter, the diaphragm 1 will continue to flex, ultimately causing the portion of the diaphragm which surrounds the contacts 7 to also come in contact with the wafer 23, as shown in FIG. 3(c). Once this occurs, the pressure between the contacts 7 and the wafer 23 is reduced.

The fluid pressure preferably should be approximately from two to four pounds per square inch. A fluidic pressure source 30 as shown in FIG. 5 may be used to generate the necessary air pressure. It can be a pump, pressurized tank, or any other source of switchable fluidic pressure.

Empirical calculation shows that two to four pounds of pressure results in the contacts 7 asserting an initial pressure against the pads on the wafer 23 in the order of 100,000 pounds per square inch, causing a solid electrical contact. For best electrical contact, the diaphragm test probe should be jogged approximately one half micron after application of pressure.

Numerous other embodiments of the present invention should now be obvious to those of ordinary skill in the art. For example, the contact leads 9 and the ground leads 11 need not be actually affixed to the diaphragm 1. The entire shape of the diaphragm test probe also could be other than circular. Means other than fluidic could also be used to assert the necessary pressure. The mounting plate and many of the other components thusfar described are also not essential.

In short, the present invention is applicable to a broad variety of other embodiments, processes and parameters and is defined and limited solely by the following claims.

What is claimed is:

1. A diaphragm test probe for establishing a detachable electrical connection with a pattern of electrical contacts on an integrated circuit comprising:
   a. a flexible sing-layer diaphragm having a thickness in the range of 5 to 15 microns;
   b. a plurality of conductive contacts, each electrically insulated form one another and affixed to said flexible diaphragm in a pattern which matches at least a portion of the pattern of the electrical contacts on the integrated circuit;

c. a plurality of contact leads, each electrically insulated from one another and connected to one of said conductive contacts; and d. pressure transfer means coupled to said flexible diaphragm for transferring pressure to the portion of said diaphragm to which said conductive contacts are affixed from a source of pressure.

2. A diaphragm test probe for establishing a detachable electrical connection with a pattern of electrical contacts on an integrated circuit comprising:

a. a flexible single-layer diaphragm having a thickness in the range of 5 to 15 microns;

b. a plurality of conductive contacts, each made of soft gold and electrically insulated from one another and affixed to said flexible diaphragm in a pattern which matches at least a portion of the pattern of the electrical contacts on the integrated circuit;

c. a plurality of contact leads, each electrically insulated from one another, connected to one of said conductive contacts, and having been affixed to said flexible diaphragm through sputtering techniques, each of said conductive contacts having been deposited on each of said contact leads and having a cross-sectional area of approximately one square mil and being spaced from one another by approximately two mils; and d. pressure transfer means coupled to said flexible diaphragm for transferring pressure to the portion of said diaphragm to which said conductive contacts are affixed from a source of pressure.

* * * * *